(12) United States Patent
Kani et al.

(10) Patent No.: US 12,148,741 B2
(45) Date of Patent: Nov. 19, 2024

(54) SIDEWALL CONNECTIONS AND BUTTON INTERCONNECTS FOR MOLDED SiPs

(71) Applicant: Apple Inc., Cupertino, CA (US)

(72) Inventors: Bilal Mohamed Ibrahim Kani, Singapore (SG); Ali N. Ergun, Sunnyvale, CA (US); Kishore N. Renjan, Singapore (SG); Kyusang Kim, Singapore (SG); Manoj Vadeentavida, Singapore (SG); Benjamin J. Grena, San Francisco, CA (US); David M. Kindlon, Felton, CA (US); Lan H. Hoang, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 273 days.

(21) Appl. No.: 17/806,412

(22) Filed: Jun. 10, 2022

(65) Prior Publication Data
US 2023/0056922 A1     Feb. 23, 2023

Related U.S. Application Data

(63) Continuation-in-part of application No. 17/407,670, filed on Aug. 20, 2021, now Pat. No. 11,765,838.

(51) Int. Cl.
*H05K 1/02* (2006.01)
*G01D 11/24* (2006.01)
(Continued)

(52) U.S. Cl.
CPC .......... *H01L 25/162* (2013.01); *G01D 11/245* (2013.01); *H01L 21/56* (2013.01); *H01L 23/315* (2013.01); *H01L 23/4985* (2013.01);
*H01L 25/165* (2013.01); *H01R 12/592* (2013.01); *H01R 12/62* (2013.01); *H01R 12/79* (2013.01); *H01R 13/6581* (2013.01); *H01R 43/205* (2013.01)

(58) Field of Classification Search
CPC  H05K 1/02; H05K 1/028; H05K 1/18; H05K 1/117; H05K 1/118; H05K 1/144; H05K 1/147; H05K 1/189; H05K 3/0014; H05K 3/18; H05K 3/303; H05K 3/363; H05K 3/366; H05K 3/4038; H05K 3/3405; H05K 3/3421; H05K 2201/03; H05K 2201/098; H05K 2201/10136; H05K 2201/10151; H05K 2201/041; H05K 2201/049; H05K 2203/048; H05K 2203/107; H10K 59/131; H10K 59/1315; H10K 77/10; H10K 77/111
USPC ............ 361/749, 679.02, 760, 783; 257/734, 257/737, 772, 777, 782, 23.023; 438/734, 438/737, 772, 777, 782, 23.023
See application file for complete search history.

(56) References Cited

U.S. PATENT DOCUMENTS 6,903,455 B2    6/2005  Sohn
8,659,138 B2    2/2014  Kobayashi et al.
(Continued)

*Primary Examiner* — Xiaoliang Chen
(74) *Attorney, Agent, or Firm* — Aikin & Gallant, LLP

(57) ABSTRACT

Electronic modules and methods of fabrication are described. In an embodiment, an electronic module includes a molded system-in-package, and a flexible circuit mounted on a side surface of a molding compound layer such that the flexible circuit is in electrical contact with a lateral interconnect exposed along the side surface of the molding compound layer.

16 Claims, 12 Drawing Sheets

(51) Int. Cl.
*H01L 21/56* (2006.01)
*H01L 23/31* (2006.01)
*H01L 23/498* (2006.01)
*H01L 25/16* (2023.01)
*H01R 12/59* (2011.01)
*H01R 12/62* (2011.01)
*H01R 12/79* (2011.01)
*H01R 13/6581* (2011.01)
*H01R 43/20* (2006.01)
*H05K 1/18* (2006.01)
*H05K 3/14* (2006.01)
*H05K 3/18* (2006.01)
*H10K 59/131* (2023.01)

(56) References Cited

U.S. PATENT DOCUMENTS

| | | |
|---|---|---|
| 9,475,963 B2 | 10/2016 | Liang et al. |
| 9,706,092 B1 | 7/2017 | Tam et al. |
| 9,761,569 B2 | 9/2017 | Yap |
| 10,420,217 B2 | 9/2019 | Yanagihashi et al. |
| 10,602,612 B1 | 3/2020 | Hoang et al. |
| 10,742,217 B2 | 8/2020 | Dabral et al. |
| 11,031,341 B2 | 6/2021 | Hossain et al. |
| 2007/0273045 A1 | 11/2007 | Kitada et al. |
| 2018/0204870 A1 | 7/2018 | Momiuchi et al. |
| 2019/0196546 A1 | 6/2019 | Wu |
| 2019/0384089 A1 | 12/2019 | Jeon et al. |
| 2020/0301193 A1 | 9/2020 | Lee et al. |
| 2020/0333655 A1 | 10/2020 | Jeon et al. |
| 2020/0335429 A1* | 10/2020 | Okaue ............ H01L 24/08 |
| 2021/0033909 A1* | 2/2021 | Lee ............ G02F 1/13336 |
| 2021/0055594 A1 | 2/2021 | Zheng |
| 2021/0066437 A1 | 3/2021 | Ryu et al. |
| 2021/0072582 A1* | 3/2021 | Kim ............ H10K 77/10 |
| 2021/0098505 A1 | 4/2021 | Cheng et al. |
| 2021/0193789 A1* | 6/2021 | Lee ............ H10K 71/00 |
| 2021/0200006 A1 | 7/2021 | Ryu et al. |
| 2021/0225746 A1 | 7/2021 | Appelt et al. |
| 2021/0263370 A1 | 8/2021 | Maeng et al. |
| 2021/0320142 A1 | 10/2021 | Noguchi et al. |
| 2021/0365157 A1 | 11/2021 | Do et al. |
| 2022/0057669 A1 | 2/2022 | Fujikawa |

* cited by examiner

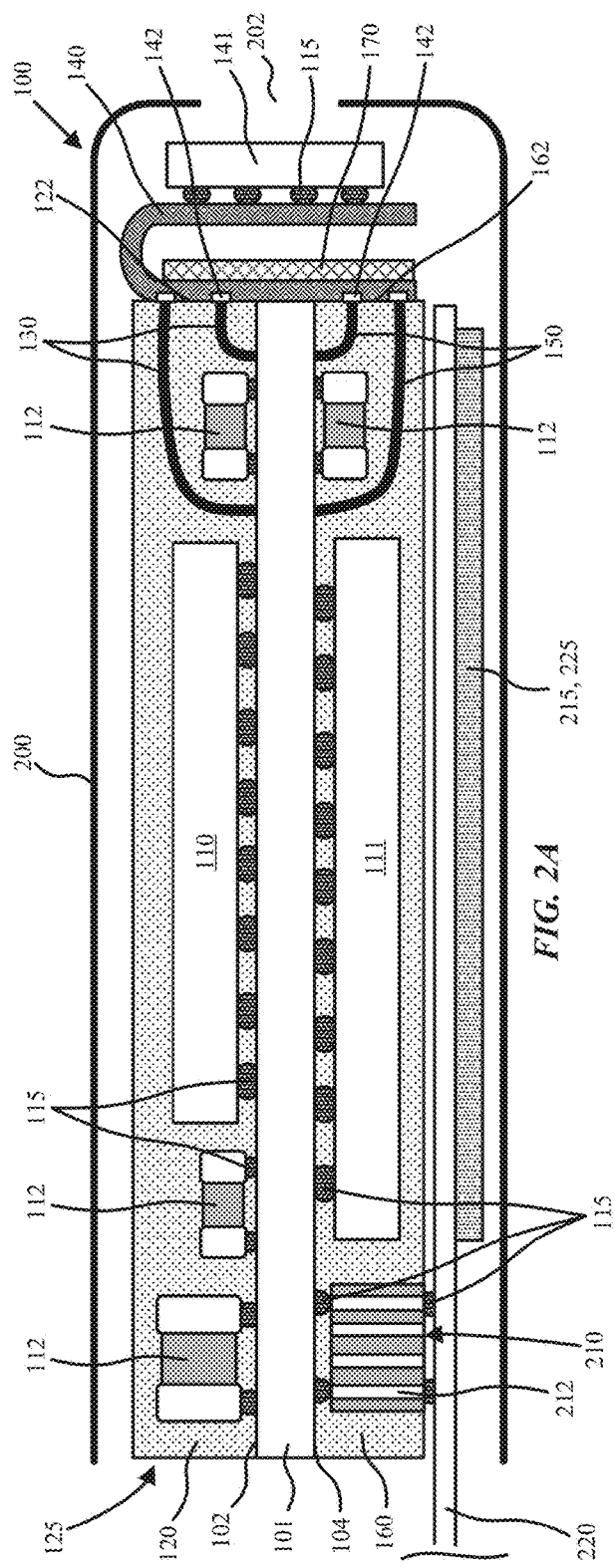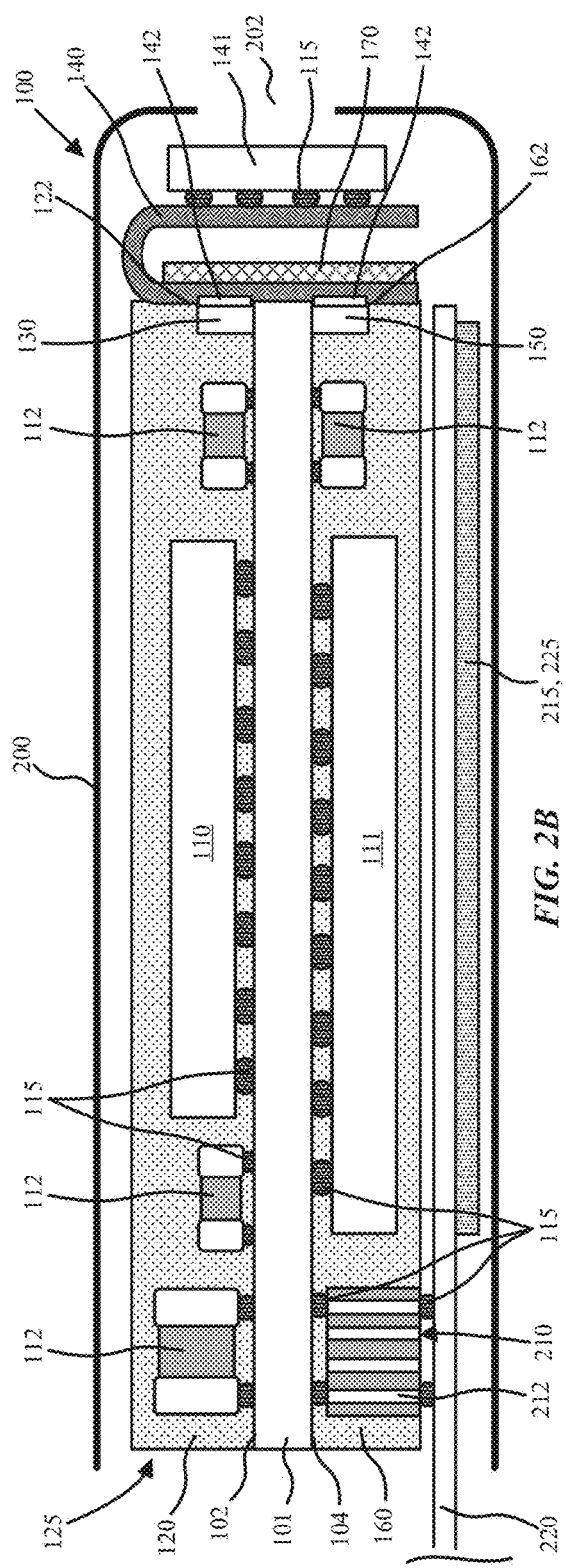

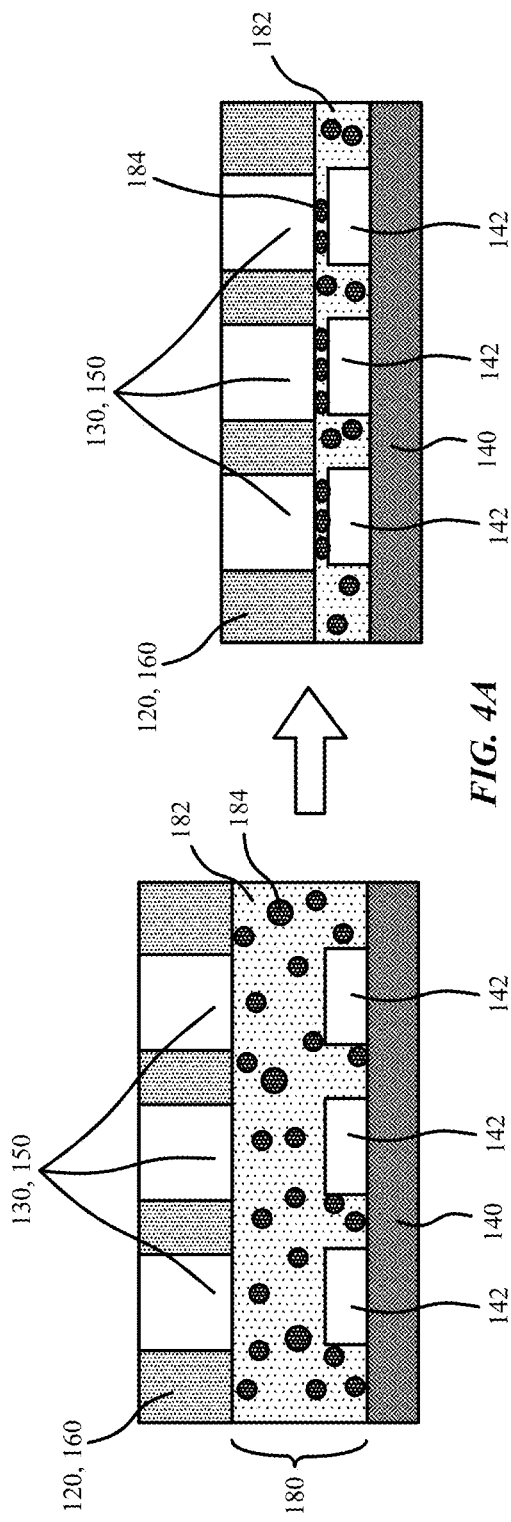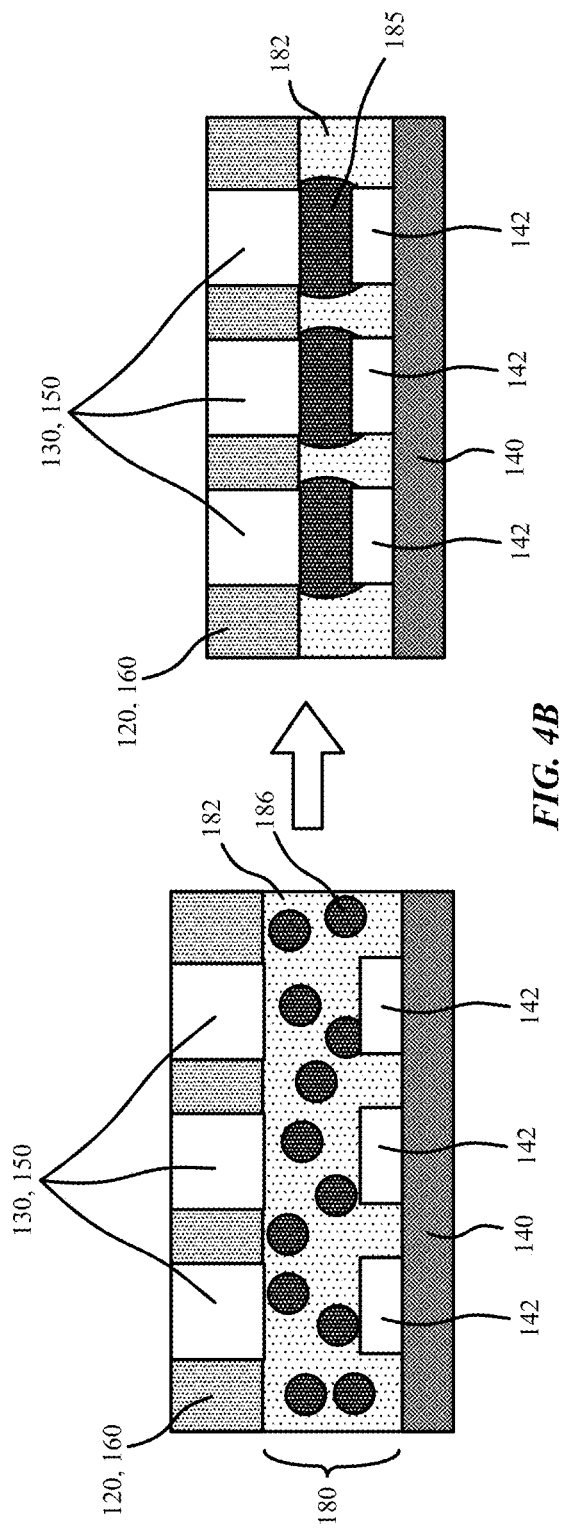

SIDEWALL CONNECTIONS AND BUTTON INTERCONNECTS FOR MOLDED SiPs

RELATED APPLICATIONS

This application is a continuation-in-part of U.S. patent application Ser. No. 17/407,670 filed Aug. 20, 2021, which is incorporated herein by reference.

BACKGROUND

Field

Embodiments described herein relate to electronic modules, and methods of connecting various systems or subsystems.

Background Information

The current market demand for portable and mobile electronic devices such as mobile phones, personal digital assistants (PDAs), digital cameras, portable players, gaming, wearables, and other mobile devices requires the integration of more performance and features into increasingly smaller spaces where available module substrate area may be restricted.

Flexible printed circuit boards (PCB), also referred to as flexible circuits, flex boards, or flexible printed circuits, are becoming more common, where unlike traditional rigid PCBs, the flexible PCBs can be bent, folded or twisted during use or to meet design objectives. Such flex boards commonly include a flexible substrate (e.g. polymer such as polyimide, polyester, polyethylene naphthalate, etc.) with laminated circuit pattern (e.g. metal foil pattern such as copper) on one or both sides of the flexible substrate. In one implementation, electronic modules include various systems or subsystems mounted onto areas of a flexible circuit. For wearable devices in particular, various systems or subsystems, such as sensors, may be secured in a specific location for interaction with the user or environment. This may be accomplished by manipulating the flexible circuit to adjust location of the target system or subsystem.

SUMMARY

Electronic modules and methods of assembly are described. In an embodiment, an electronic module includes a flexible module routing substrate and a plurality of systems mounted on the flexible module routing substrate. A system-in-package (SiP) is also mounted on the flexible module routing substrate. The SiP may include a lateral interconnect encapsulated in a molding compound, and a flexible circuit is mounted on a side surface of the molding compound layer where the lateral interconnect is exposed such that a landing pad of the flexible circuit is in electrical contact with the lateral interconnect. In this manner a right angle sidewall interconnection can be made.

In an embodiment, an electronic module includes a SiP including a routing substrate, and a first electronic component mounted on a first side of the routing substrate and encapsulated in a first molding compound layer. A first lateral interconnect may be bonded to the first side of the routing substrate and also encapsulated in the first molding compound layer. In an embodiment, the first lateral interconnect is exposed along a side surface of the first molding compound layer. A flexible circuit can be mounted on the first side surface of the first molding compound layer such that a first landing pad of the flexible circuit is in electrical contact with the first lateral interconnect exposed along the first side surface of the first molding compound layer.

In another embodiment, side surface interconnection for an SiP is accomplished with a socket connector housing. An electronic module can include an SiP that includes a routing substrate and a first component mounted on a first side of the routing substrate and encapsulated in a first molding compound layer. A socket connector housing can also be mounted on the routing substrate and within a cavity in the first molding compound layer, where the cavity is exposed along a first side surface of the first molding compound layer. The socket connector housing can include a side receptacle opening to receive a flexible circuit, which can be inserted into the cavity from outside the first molding compound layer and connected inside the side receptacle opening of the socket connector housing.

In another embodiment, an electronic module includes a SiP that includes a routing substrate and a first component mounted on a first side of the routing substrate and encapsulated in a first molding compound layer. A vertical interconnect may be bonded to the first side of the routing substrate and also encapsulated in the first molding compound layer. In an embodiment, a portion of the first vertical interconnect protrudes form a top exterior surface of the first molding compound layer, and an electronic assembly is bonded to the vertical interconnect of the SiP with a solder material. For example, this may be facilitated by placing a reflowable button around the vertical interconnect.

BRIEF DESCRIPTION OF THE DRAWINGS

FIG. 2A is a cross-sectional side view illustration of an electronic module including a pin or wirebond wire lateral interconnect in accordance with an embodiment.

FIG. 2B is a cross-sectional side view illustration of an electronic module including a stud or solder bump stack lateral interconnect in accordance with an embodiment.

FIG. 4A is a close-up cross-sectional side view illustration for bonding a flexible circuit to SiP with an anisotropic conductive film in accordance with an embodiment.

FIG. 4B is a close-up cross-sectional side view illustration for bonding a flexible circuit to SiP with a self-alignment paste in accordance with an embodiment.

DETAILED DESCRIPTION

Figure 1:
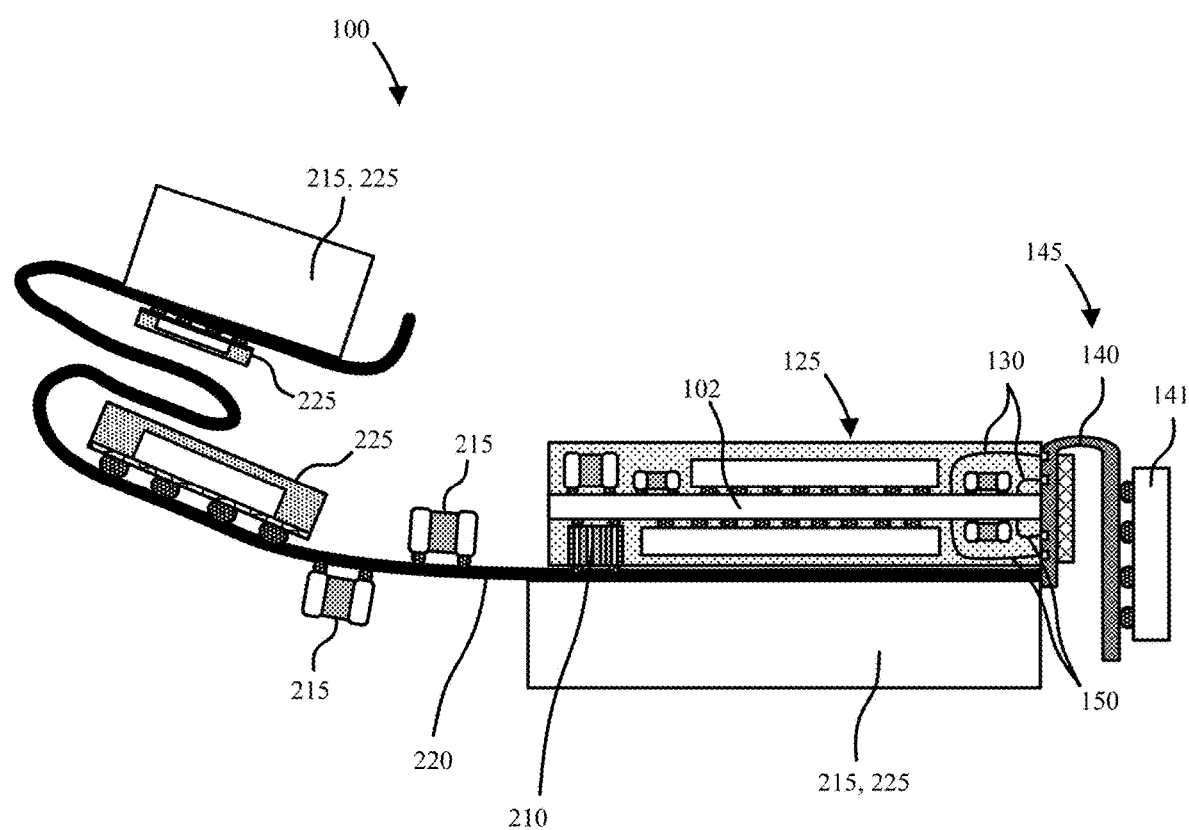
FIG. 1 is a schematic cross sectional side view illustration of an electronic module including a module routing substrate and a plurality of components and systems or subsystems mounted on the module routing substrate in accordance with an embodiment.

Embodiments describe electronic modules and methods of assembly. In an embodiment, an electronic module includes a system-in-package (SiP) and flexible circuit connected with the SiP. The SiP may include a routing substrate, such as a flexible or rigid printed circuit board (PCB), a first electronic mounted on a first side of the routing substrate and encapsulated in a first molding compound layer, and a first lateral interconnected bonded to the first side of the routing substrate and encapsulate din the first molding compound layer, and exposed along a first side surface of the first molding compound layer. In accordance with embodiments, the flexible circuit can be mounted on the first side surface of the first molding compound layer, where a first landing pad of the flexible circuit is in electrical contact with the first lateral interconnect exposed along the first side surface of the first molding compound layer. In this manner, the first lateral interconnect can form a right angle interconnection connection of a flexible circuit to the SiP.

In one aspect, side surface lateral interconnects (such as a right angle interconnect) for SiP may be incorporated due to constrained space on top or bottom sides of a molded SiP. Such configurations thus can leverage previously unused sidewall space for forming SiP to SiP or other peripheral assembly or subassembly interconnections for efficient space utilization. In addition, routing for the SiP routing substrate can be simplified. Furthermore, the SiP top and bottom sides can then be utilized for functions such as electromagnetic interference (EMI) shielding or an antenna in the constrained space available, while the connected peripheral SiP, assembly, or subassembly can be located with less interference that an overlying an EMI shielding or antenna could otherwise potentially cause.

In accordance with embodiments, an electronic module is fabricated using the application of solder button joints onto an exposed vertical interconnect feature, such as a wire bond pillar, copper pillar or pin, solder ball stack, etc., that protrudes from a molding compound. Such a fabrication technique can be leveraged for electronic assemblies including lateral interconnects, as well as for fabricating three-dimensional 3D molded stacks. This may allow for miniaturization without substantial changes at system level as the button joint features can be part of an assembly or subassembly that is mounted onto another assembly or subassembly that is not redesigned.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", and "on" as used herein may refer to a relative position of one layer with respect to other layers. One layer "over", or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1 a schematic cross sectional side view illustration of an electronic module including a module routing substrate 220 and a plurality of components 215 and systems or subsystems 225 and system-on-packager (SiP) 125 mounted on the module routing substrate 220. In an embodiment, SiP 125 is mounted adjacent an end or edge of the module routing substrate 220. As shown the module routing substrate 220 may be flexible, and bent into a variety of shapes in order to fit into an irregular shaped housing. For example, the module routing substrate 220 may include flexible dielectric layers (e.g. polymer such as polyimide, polyester, polyethylene nphthalate, etc.) with laminated circuit patterns (e.g. metal foil pattern such as copper) on one or both sides of the flexible dielectric layers. Multiple layer module routing substrates 220 can include multiple layers of laminated metal foil layers including metal routing layers, as well as top and bottom side passivation (e.g. polyimide).

In accordance with embodiments, a system or subsystem 145 can be mounted onto a side surface of SiP 125 utilizing a flexible circuit 140 and lateral interconnects 130, 150. The flexible circuit 140 may be formed of similar materials as the module routing substrate 220, though of smaller scale. As shown, the SiP 125 may include electronic components 110, 111, 112 on both sides of a routing substrate 101, and be molded on both sides. The electronic components 110, 111, 112 may be attached using a suitable manner, such as solder bumps 115 (or micro bumps), conductive films, conductive pastes, wirebonding, etc.

Additionally, the routing substrate 101 may be electrically connected to the module routing substrate 220 through an interposer 210 including interconnects 212. In accordance with embodiments, an additional system or subsystem 145 can be directly connected to a side surface of the SiP 125 using one or more lateral interconnects 130, 150 and flexible circuit 140. In this manner, routing complexity of the module routing substrate 220 can be reduced. Additionally, total thickness of the module may be reduced.

Referring now to FIGS. 2A-2B, FIG. 2A is a cross-sectional side view illustration is provided of an electronic module 100 including a pin or wirebond wire lateral interconnect 130, 150 in accordance with an embodiment; FIG. 2B is a cross-sectional side view illustration of an electronic module 100 including a metal stud bump or solder bump stack lateral interconnect 130, 150 in accordance with an embodiment. The lateral interconnects of FIG. 2B may each include a single metal stud bump (e.g. copper stud) or solder bump, or a stack thereof. As shown in each of FIGS. 2A-2B, the electronic module 100 includes a system-in-package (SiP) 125 and flexible circuit 140 mounted on the SiP 125. The flexible circuit 140 can include landing pads 142 (e.g. copper pads) in electrical connection with the lateral interconnects 130, 150. The flexible circuit 140 can additionally be secured in place with a mechanical stiffener 170 on a side opposite the SiP 125. The flexible circuit 140 may be a part of a separate system or subsystem 145, and can include one or more additional integrated electronic components 141. In an embodiment, the integrated electronic component 141 includes a sensor oriented adjacent an opening 202 in a housing 200 within which the electronic module 100 is secured.

In the illustrated embodiment the SiP 125 can include a routing substrate 101, such as a flexible or rigid PCB, a first electronic component 110 mounted on a first side 102 of the routing substrate (e.g. with solder bumps 115, etc.) and encapsulated in a first molding compound layer 120, and a first lateral interconnect 130 bonded to the first side 102 of the routing substrate 101. The first lateral interconnect 130 is also encapsulated in the first molding compound layer 120 and is exposed along a first side surface 122 of the first molding compound layer 120. For example, this may be accomplished using a singulating/cutting operation or patterning (e.g. etching, drilling, etc.) of the first molding compound layer 120 to expose the first lateral interconnect 130. As shown, a flexible circuit 140 is mounted on the first side surface 122 of the first molding compound layer 120 such that a first landing pad 142 of the flexible circuit 140 is in electrical contact with the first lateral interconnect 130 that is exposed along the first side surface 122 of the first molding compound layer 120.

The routing substrate 101 in accordance with embodiments can be a rigid substrate or flexible substrate. In an embodiment, the routing substrate 101 is a laminate. For example, the routing substrate 101 can be a composite of woven fiberglass cloth and polymer (e.g. resin) and metal routing layers. The routing substrate 101 may be formed of a variety of suitable printed circuit board materials including FR4, prepreg, polyimide, etc. The routing substrate 101 may be rigid or flexible.

The SiP 125 may include components mounted on both sides of the routing substrate 101. A second electronic component 111 can also be mounted on a second side 104 (e.g. opposite the first side 102) of the routing substrate 101 and encapsulated in a second molding compound layer 160. Similarly, a second lateral interconnect 150 can be bonded to the second side 104 of the routing substrate 101, encapsulated in the second molding compound layer 160, and exposed along a second side surface 162 of the second molding compound layer 160. The second side surface 162, and first side surface 122 may be co-planar, and created with the same singulating or cutting operation. The flexible circuit 140 may also be mounted on the second side surface 162 of the second molding compound layer 160, with a second landing pad 142 of the flexible circuit 140 in electrical contact with the second lateral interconnect 150 exposed along the second side surface 162 of the second molding compound layer 160.

It is to be appreciated that while only a single first electronic component 110 is illustrated as being mounted on the first side 102 of the routing substrate 101, a plurality of first electronic components 110 can be mounted. Similarly, a plurality of second electronic components 111 can be mounted on the second side 104 of the routing substrate 101. Both possibilities are illustrated generally with additional electronic components 112 in FIG. 2A mounted on both sides of the routing substrate 101. The electronic components in accordance with embodiments can be dies ranging from system-on-chip (SOC) to memory, passive components (resistors, capacitors, inductors, etc.), micro-electromechanical systems (MEMS), sensors, etc. A variety of configurations of different electronic components is understood.

Figure 3A:
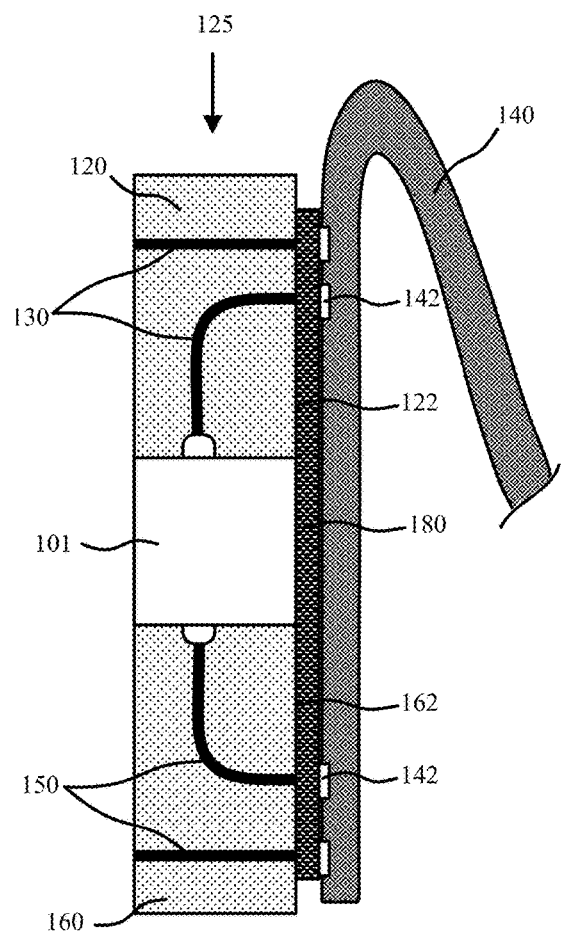
FIG. 3A is a close-up cross-sectional side view illustration of an electronic module including a flexible circuit bonded to an SiP with a continuous bonding layer film in accordance with an embodiment.
Figure 3B:
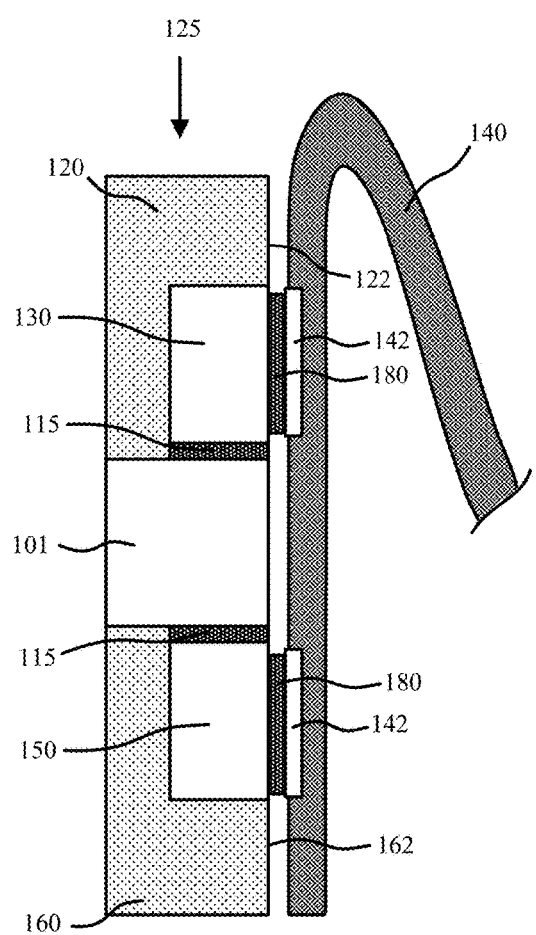
FIG. 3B is a close-up cross-sectional side view illustration of an electronic module including a flexible circuit bonded to an SiP with a plurality of separate bonding layer films in accordance with an embodiment.

The flexible circuits 140 in accordance with embodiments can be attached to the SiP 125 using a suitable material to provide adhesion and electrical connection with landing pads 142. FIG. 3A is a close-up cross-sectional side view illustration of an electronic module including a flexible circuit 140 bonded to an SiP 125 with a continuous bonding layer film 180 in accordance with an embodiment. FIG. 3B is a close-up cross-sectional side view illustration of an electronic module including a flexible circuit 140 bonded to an SiP 125 with a plurality of separate bonding layer films 180 in accordance with an embodiment. For example, a separate bonding layer film may be applied for each landing pad 142. It is to be appreciated that while separate bonding layer films 180 are illustrated for different lateral interconnects 130, 150 in FIGS. 3A-3B, this is applicable for either configuration, which can be partly dependent on surface area of the exposed lateral interconnects 130, 150 and bonding alignment capabilities. It may additionally be possible to form wider lateral interconnects 130, 150 with U-shaped copper pins than wirebond wires, for example, with better alignment. For example, a wirebond wire in accordance with an embodiment can have a maximum width of 25-75 μm where exposed along the first side surface of the first molding compound layer. In an embodiment, a copper pin can have a maximum width of 250-500 μm where exposed along the first side surface of the first molding compound layer. Larger areas can be provided with metal stud bumps, solder bumps, etc.

FIG. 4A is a close-up cross-sectional side view illustration for bonding a flexible circuit 140 to SiP 125 with an anisotropic conductive film in accordance with an embodiment. As shown, an anisotropic film (bonding layer film) can include an adhesive matrix 182 such as epoxy, and a conductive filler such as metal particles 184. Upon application of heat and pressure, particles sandwiched between the landing pads 142 and lateral interconnects 130, 150 provide an electrically conductive path, and the adhesive matrix is cured.

FIG. 4B is a close-up cross-sectional side view illustration for bonding a flexible circuit 140 to SiP 125 with a self-alignment paste in accordance with an embodiment. As shown, a self-alignment paste (bonding layer film) can include an adhesive matrix 182 such as epoxy, and a conductive filler such as solder particles 186. Upon application of heat the solder particles coalesce and form solder joints 185 between the landing pads 142 and lateral interconnects 130, 150 provide an electrically conductive path, and the adhesive matrix is cured.

Figure 5:
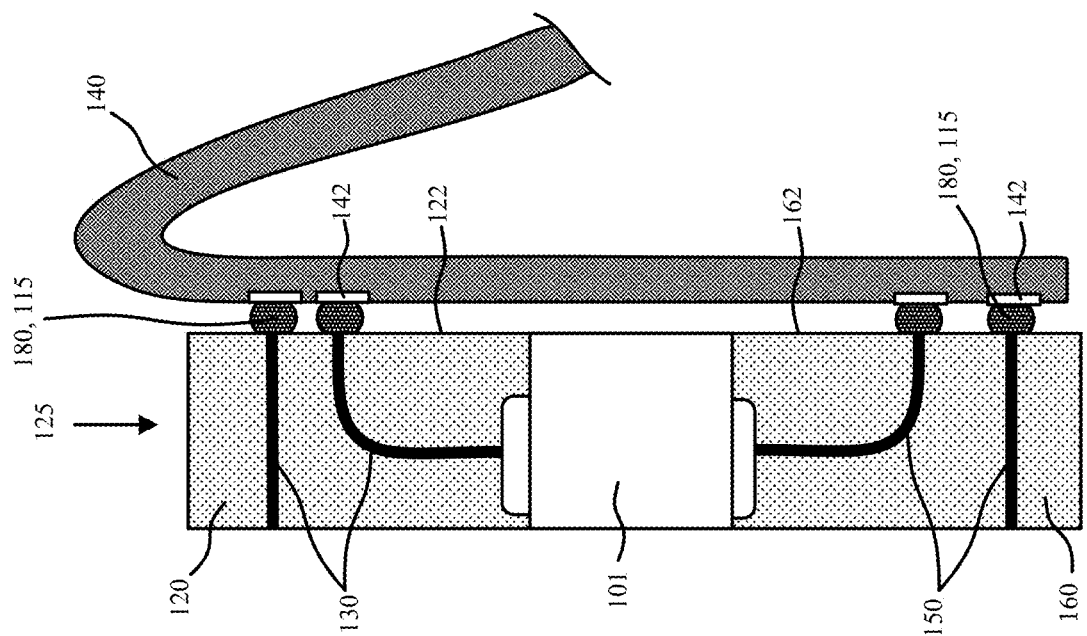
FIG. 5 is a close-up cross-sectional side view illustration of an electronic module including a flexible circuit bonded to an SiP with a plurality of separate solder bumps in accordance with an embodiment.

Referring now to FIG. 5, a close-up cross-sectional side view illustration is provided of an electronic module including a flexible circuit 140 bonded to an SiP 125 with a plurality of separate solder bumps 115 (bonding layer films) in accordance with an embodiment.

Figure 6:
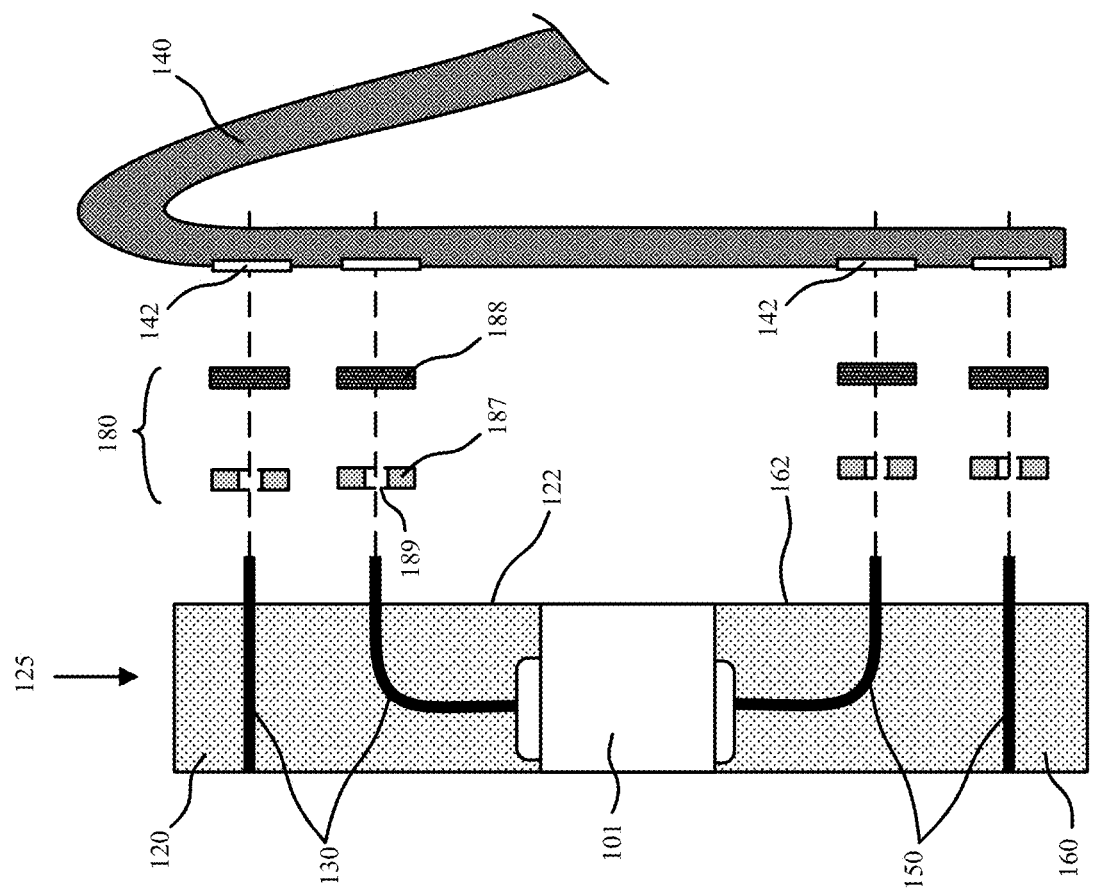
FIG. 6 is a close-up cross-sectional side view illustration of an electronic module including a flexible circuit bonded to an SiP with a plurality of separate button joints in accordance with an embodiment.

FIG. 6 is a close-up cross-sectional side view illustration of an electronic module including a flexible circuit 140 bonded to an SiP 125 with a plurality of separate button joints in accordance with an embodiment. In the illustrated embodiment, the lateral interconnects 130, 150 may protrude from the side surfaces 122, 162 of the molding compound layers 120, 160. A solder material (bonding layer film 180) bonds the lateral interconnects to the flexible circuit 140. As shown, this can be accomplished by first placing buttons 187 around the protruding lateral interconnects, and optional top solder paste 188. In an embodiment the buttons include a center hole that fits around the protruding lateral interconnect. For example, the buttons may be ring shaped. The buttons 187 may be formed of a reflowable solder material. Upon applying heat and pressure the buttons 187 and solder paste 188 can reflow to create a solder joint.

Figure 7:
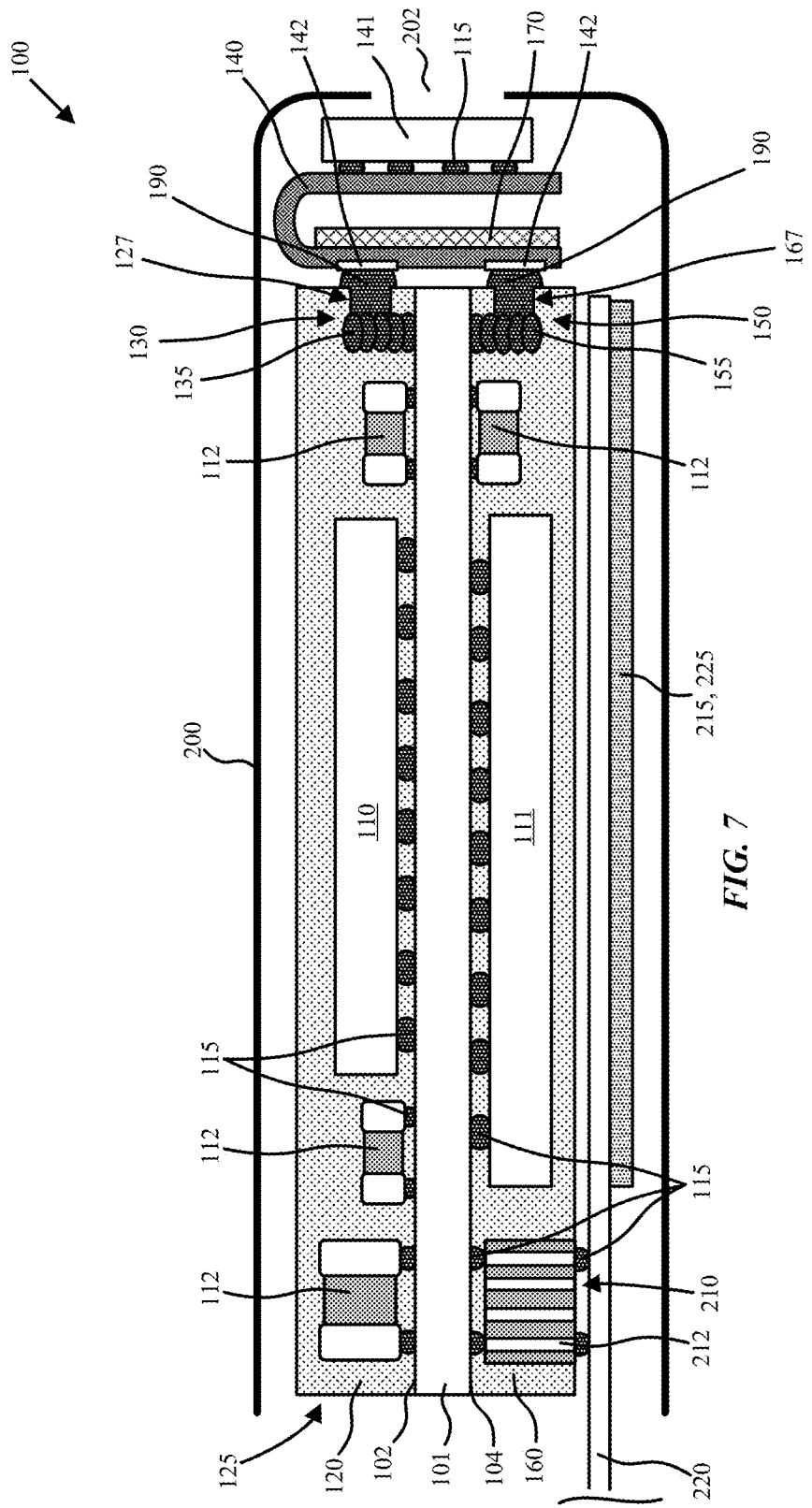
FIG. 7 is a close-up cross-sectional side view illustration of an electronic module including a flexible circuit bonded to an SiP through a side via in accordance with an embodiment.

Referring now to FIG. 7 is a close-up cross-sectional side view illustration is provided for an electronic module including a flexible circuit 140 bonded to an SiP 125 through a side via 127, 167 formed in the molding compound layer 120,1 60 in accordance with an embodiment. As shown the lateral interconnects 130, 150 can include a vertical interconnect of one or more solder bumps 135, 155 metal stud bumps, wire, etc. and a side solder bump 190 or other conductive filler within side vias 127, 167. As shown, side vias 127, 167 are formed in the side surfaces 122, 162 of the molding compound layers 120, 160 and a solder bumps 190 can be used to bond the flexible circuit 140. The solder bumps 190 may at least partially, or fully, fill the side vias 127, 167 after reflow.

Figure 8A:
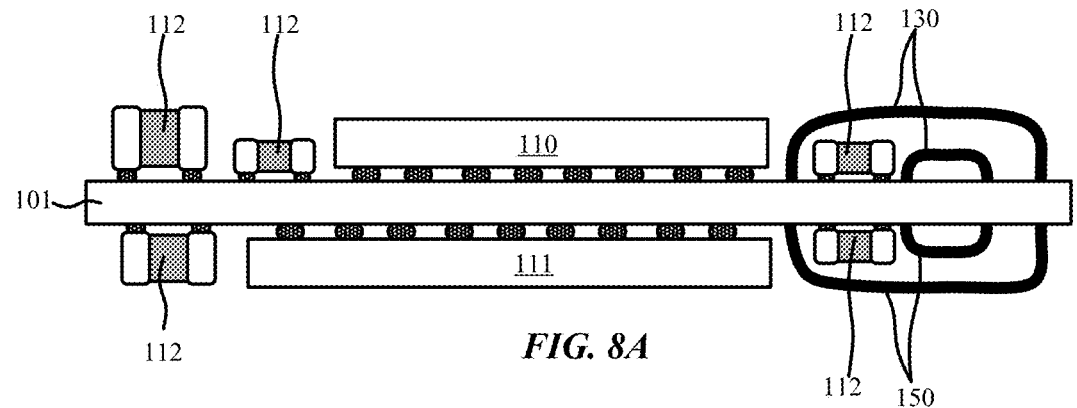
FIGS. 8A-8C are cross-sectional side view illustrations of method of forming an electronic module including a pin or wirebond wire lateral interconnect in accordance with an embodiment.
Figure 8B:
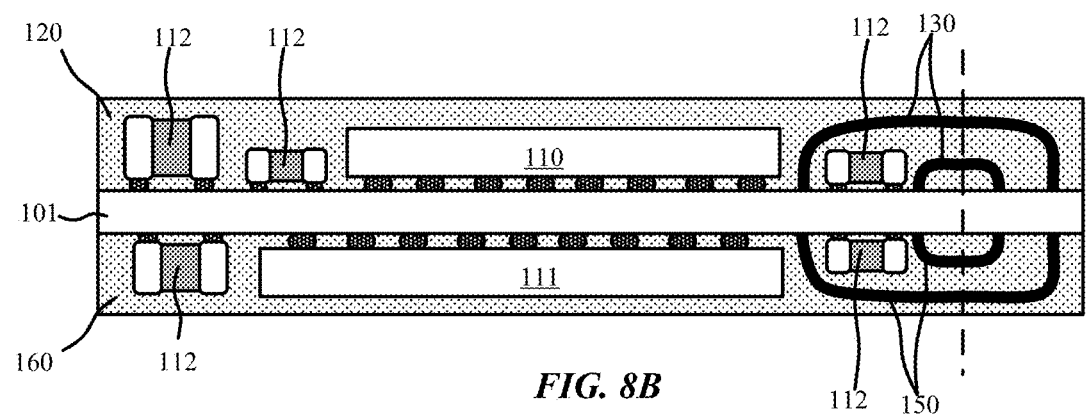
Figure 8C:
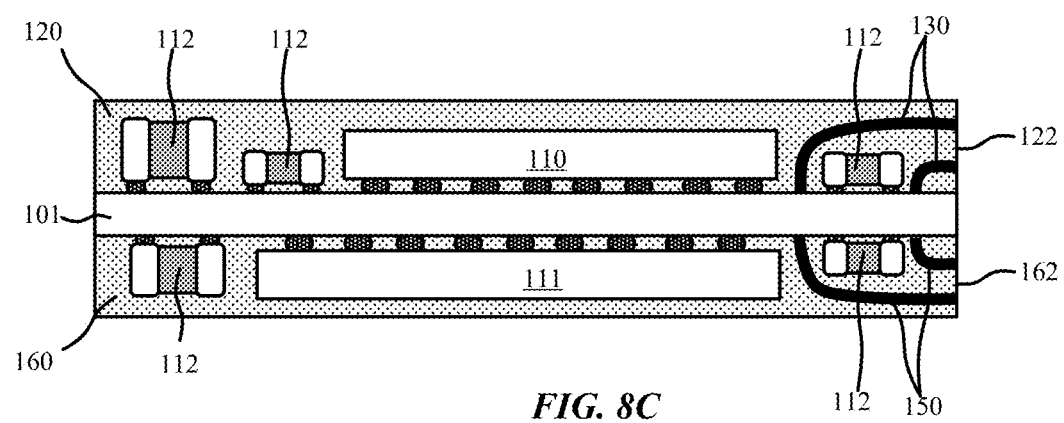

FIGS. 8A-8C are cross-sectional side view illustrations of method of forming an electronic module including a pin or wirebond wire lateral interconnect in accordance with an embodiment. Specifically, the process flow of FIGS. 8A-8C can be used to fabricate the electronic module of FIG. 2A. Initially the one or more electronic components 110, 111 and additional electronic components 112 are surface mounted on the routing substrate 101 as shown in FIG. 8A.

Additionally, the lateral interconnects 130, 150 can be added. For example, copper pins can be surface mounted in a U-shape loop structure. Similarly wire bond wire loops can be bonded in a U-shape loop structure.

One or both sides of the routing substrate 101 can then be overmolded (encapsulated) with molding compound layers 120, 160 as shown in FIG. 8B. The U-shape loop structures, molding compound layer, and routing substrate can then be cut (e.g. singulation process) to expose a portion of the lateral interconnects along the side surfaces of the molding compound layers, resulting in the structure illustrated in FIG. 8C. The extension section which has been singulated may be a part of another SiP, or a dummy feature. A flexible circuit 140 can then be bonded to the singulated side surfaces 122, 162 of the molding compound layers 120, 160 with exposed lateral interconnects 130, 150 using a suitable bonding layer film such as previously described with regard to FIGS. 3A-5.

In an alternative process flow, the molding operation does not entirely cover the U-shaped loop structures. Thus, after molding, and singulation the lateral interconnects 130, 150 may extend from the side surfaces 122, 162 of the molding compound layers. Button joints may then be used for bonding with the flexible circuit 140 as described with regard to FIG. 6.

Figure 9A:
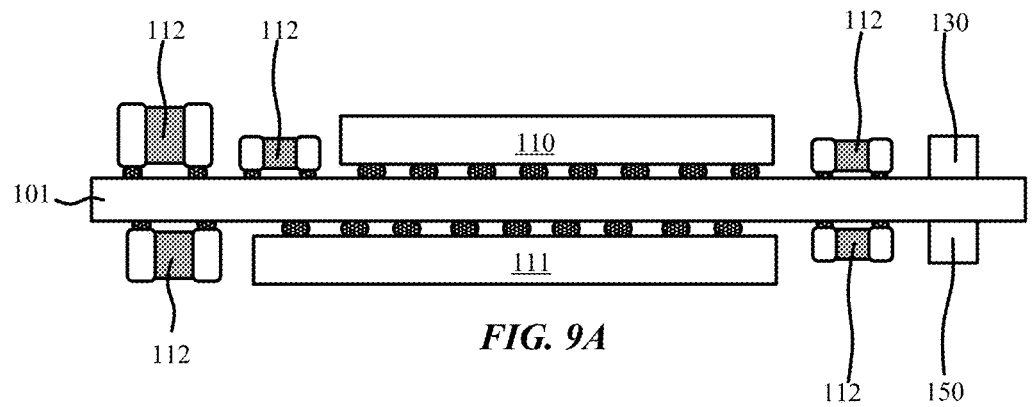
FIGS. 9A-9C are cross-sectional side view illustrations of method of forming an electronic module including a stud or solder bump stack lateral interconnect in accordance with an embodiment.
Figure 9B:
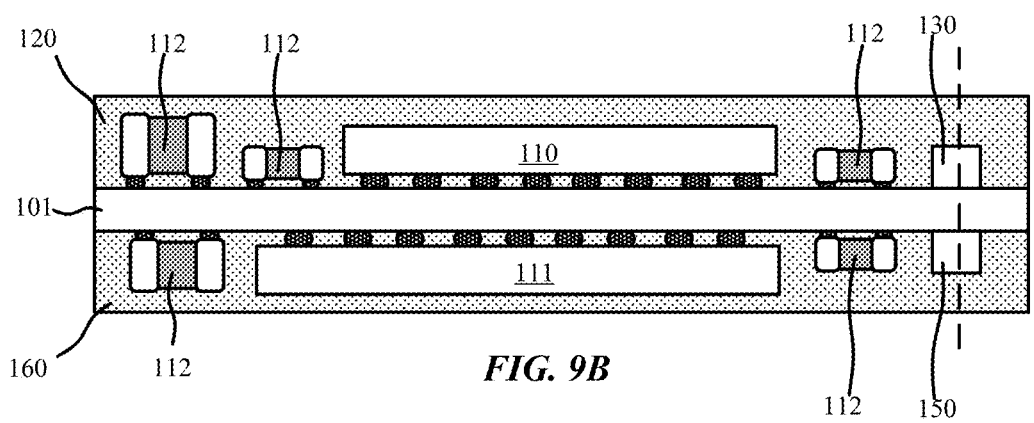
Figure 9C:
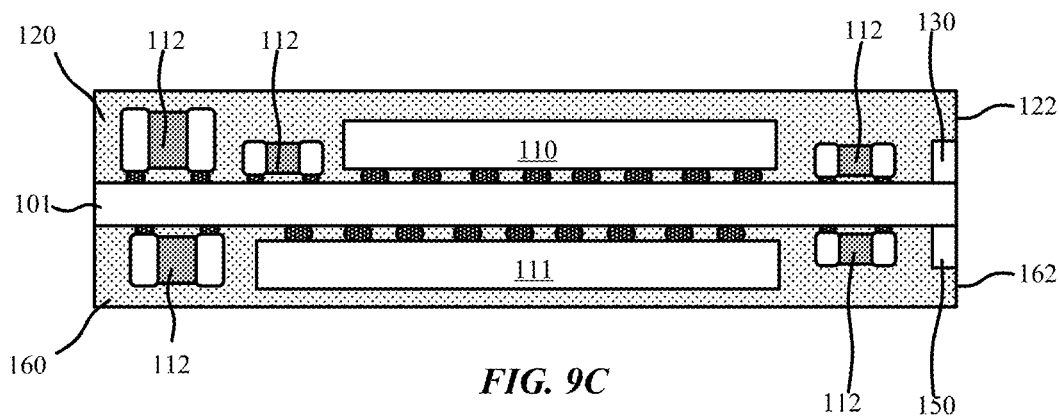

FIGS. 9A-9C are cross-sectional side view illustrations of method of forming an electronic module including a stud or solder bump stack lateral interconnect in accordance with an embodiment. Specifically, the process flow of FIGS. 9A-9C can be used to fabricate the electronic module of FIG. 2B. Initially the one or more electronic components 110, 111 and additional electronic components 112 are surface mounted on the routing substrate 101 as shown in FIG. 8A. Additionally, the lateral interconnects 130, 150 can be added. For example, lateral metal stud bumps or solder bumps can be added. Metal stud bumps can be mounted using a solder or conductive material. Additionally, stacks of metal stud bumps or solder bumps can be added.

One or both sides of the routing substrate 101 can then be overmolded with molding compound layers 120, 160 as shown in FIG. 9B. The lateral interconnects 130, 150 can then be singulated, for example, in a wafer sawing operation, resulting in the structure illustrated in FIG. 9C. The extension section which has been singulated may be a part of another SiP, or a dummy feature. A flexible circuit 140 can then be bonded to the singulated side surfaces 122, 162 of the molding compound layers 120, 160 with exposed lateral interconnects 130, 150 using a suitable bonding layer film such as previously described with regard to FIGS. 3A-5.

Figure 10A:
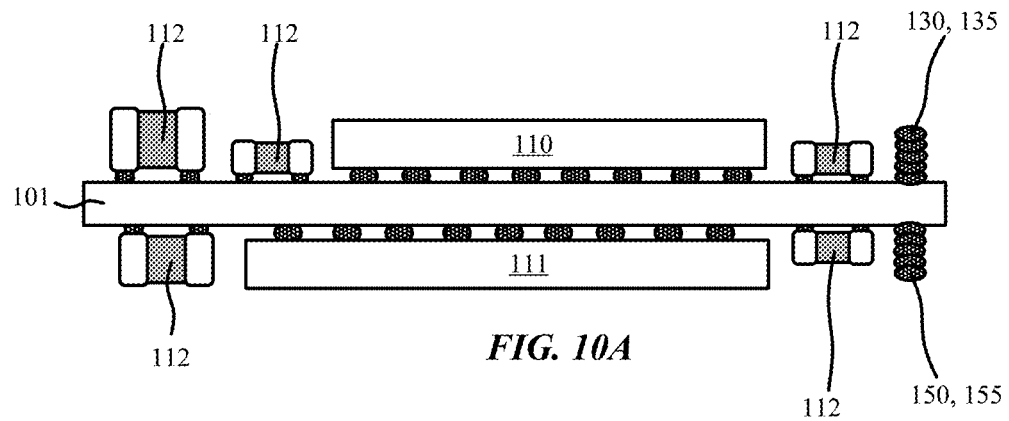
FIGS. 10A-10C are cross-sectional side view illustrations of method of forming an electronic module including a flexible circuit bonded to an SiP through a side via in accordance with an embodiment.
Figure 10B:
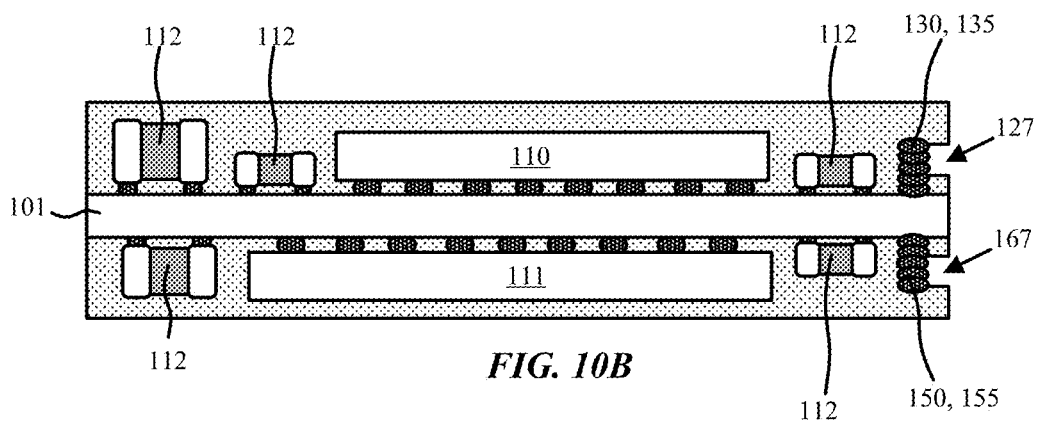
Figure 10C:
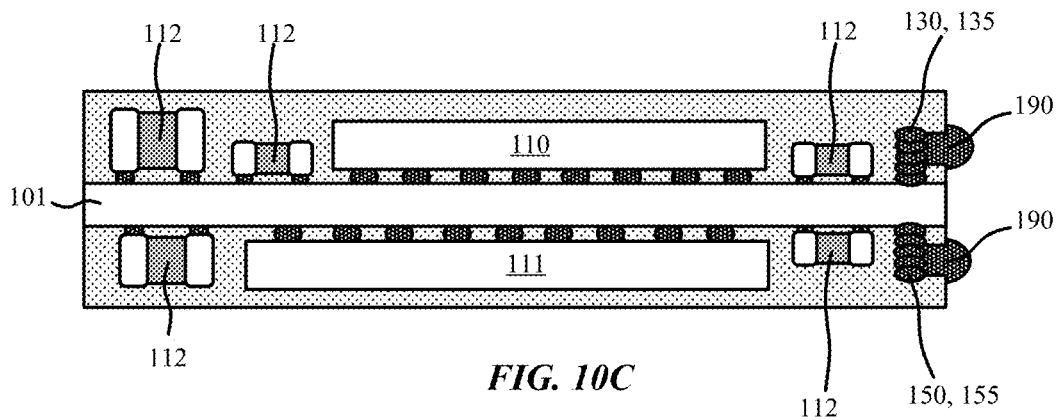

FIGS. 10A-10C are cross-sectional side view illustrations of method of forming an electronic module including a flexible circuit bonded to an SiP through a side via in accordance with an embodiment. Specifically, the process flow of FIGS. 10A-10C can be used to fabricate the electronic module of FIG. 7. Initially the one or more electronic components 110, 111 and additional electronic components 112 are surface mounted on the routing substrate 101 as shown in FIG. 10A. Additionally, the lateral interconnects 130, 150 can be added. For example, lateral metal stud bumps or solder bumps can be added similarly as described with regard to FIG. 9A. Metal stud bumps can be mounted using a solder or conductive material. Additionally, stacks of metal stud bumps or solder bumps can be added.

One or both sides of the routing substrate 101 can then be overmolded with molding compound layers 120, 160 as shown in FIG. 10B. With the stacks of metal stud bumps or solder bumps encapsulated inside the molding compound layers. Side vias 127, 167 are then formed in the side surfaces 122, 162 of the molding compound layers 120, 160 to expose the stacks of metal stud bumps or solder bumps. As shown in FIG. 9C10C, solder bumps 190 can be added to the side vias 127, 167. A flexible circuit 140 can then be bonded directly to the solder bumps 190.

In an alternative process flow, rather than forming and aligning sidewall interconnects directly with a singulated side surface of a molding compound a socket connector housing can be mounted on the routing substrate, and subsequently exposed with singulation. In this manner, size and alignment of connections can be precisely and repeatably controlled.

Figure 11:
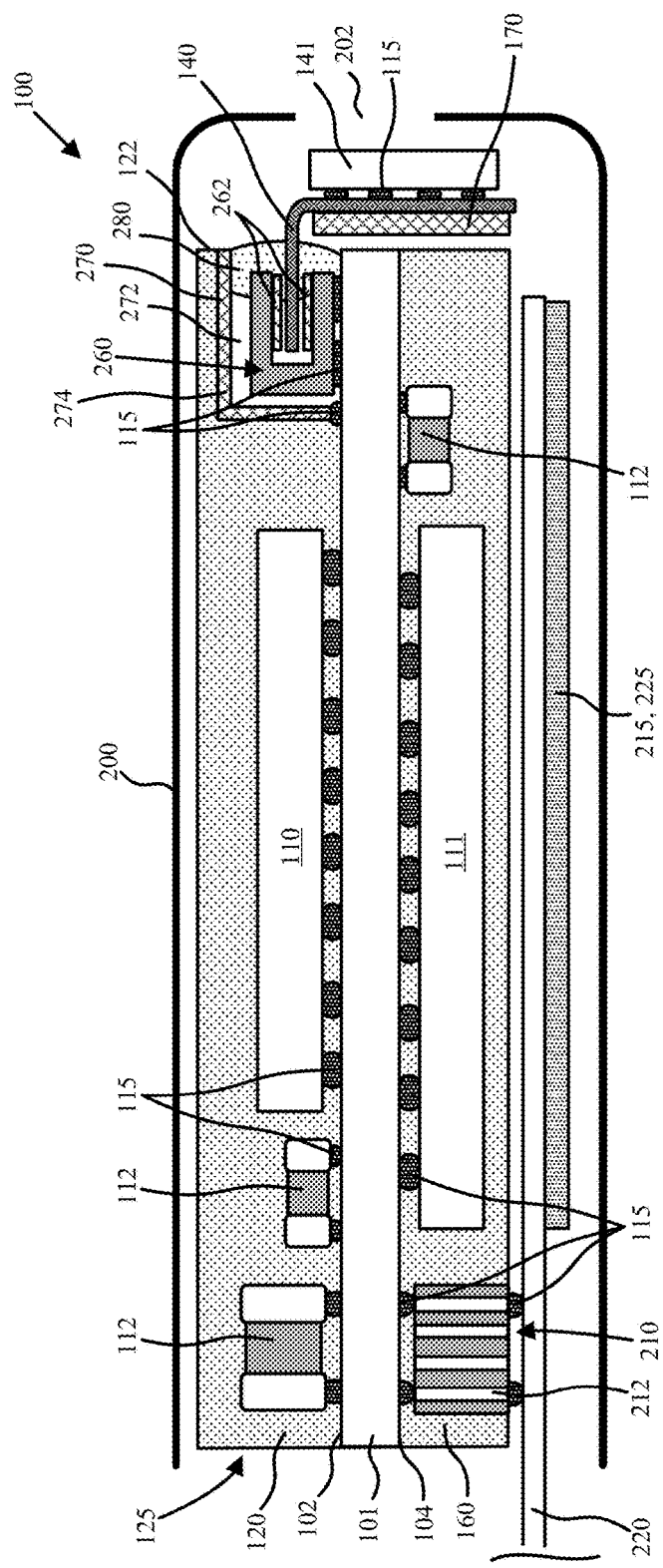
FIG. 11 is a close-up cross-sectional side view illustration of an electronic module including a flexible circuit bonded to an SiP through a socket connector housing in accordance with an embodiment.
Figure 12:
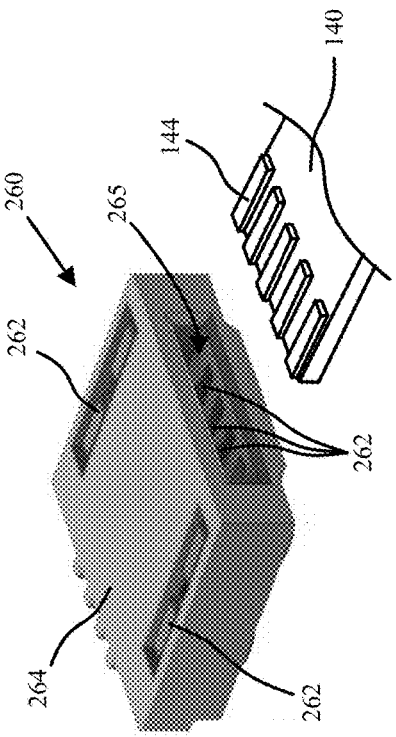
FIG. 12 is an isometric view illustration of a flexible circuit and socket connector housing in accordance with an embodiment.

FIG. 11 is a close-up cross-sectional side view illustration of an electronic module including a flexible circuit bonded to an SiP through a socket connector housing in accordance with an embodiment. FIG. 12 is an isometric view illustration of a flexible circuit and socket connector housing in accordance with an embodiment. Referring now to both FIGS. 11-12, in an embodiment an electronic module 100 includes a SiP 125 similar to previous descriptions. The primary difference of the embodiments illustrated in FIGS. 11-12 is with the integration of the socket connector housing 260 for sidewall interconnection to the SiP 125. In interest of clarity and conciseness, similarities with previously described embodiments are not repeated in the following description.

As shown, the SiP 125 includes a routing substrate 101 and a first electronic component 110 mounted on a first side 102 of the routing substrate 101 and encapsulated in a first molding compound layer 120. A socket connector housing 260 is also mounted on the routing substrate 101 and within a cavity 272 in the first molding compound layer 120. For example, the socket connector housing 260 may be surface mounted with solder bumps 115 to facilitate bonding and electrical connection with the routing substrate 101. As shown in more detail in FIG. 12, the socket connector housing 260 can include a side receptacle opening 265 for receiving a flexible circuit 240. The cavity 272 can be exposed along a first side surface 122 of the first molding compound layer 120, with the side receptacle openings 265 facing the cavity 272 opening in the first side surface 122. In this manner, a flexible circuit 140 can extend into the cavity 272 from outside the first molding compound layer 120 and connect inside the side receptacle opening 265 of the socket connector housing 260.

In accordance with embodiments, a shield can 270 can be located over the socket connector housing 260 and embedded within the first molding compound layer 120. The shield can 270 can be electrically conductive (e.g. metal) or insulating, and may be bonded to the routing substrate 101 with a suitable adhesive material (including solder) to secure the shield can 270 on the routing substrate 101. Prior to singulation the shield can 270 may completely laterally surround the socket connector housing 260 so as to prevent the influx of molding compound 120 during overmolding. As such, the cavity 272 may be defined by the shield can 270, which can facilitate unabated access to the side receptacle opening 265 of the socket connector housing 260.

The shield can 270 can be a separate component from the socket connector housing 260, or a part of socket connector housing 260. In the exemplary embodiment illustrated in FIG. 11 and open space separates the top surface 264 of the socket connector housing a lid 274 of the shield can 270. The lid 274 of the shield can 270 can also be directly on the top surface 264 (or form the top surface 264) of the socket connector housing 260. A back side of the socket connector housing 260 (opposite the side receptacle opening 265) can be located close to or in contact with a sidewall of the shield can 270 for increased packing density of the SiP. Similarly, side surfaces of the socket connector housing 260 can be located close to or in contact with sidewalls of the shield can 270. In some embodiments, the socket connector housing 260, and entrance to the side receptacle opening 265 is laterally offset form the first side surface 122 of the first molding compound layer 120. This may protect the socket connector housing 260, for example, during singulation of the SiP 125.

Following singulation of the SiP 125 to expose the cavity 272 and socket connector housing 260, a flexible circuit 140 can be inserted into the side receptacle opening 265 and connected. For example, this may be achieved by a plurality of spring compression contacts on the flexible circuit 140 and/or within the socket connector housing 260. In the embodiment illustrated in FIG. 12 the socket connector housing 260 includes a plurality of spring compression contacts 262, which can be located on a top side and/or bottom side of the side receptacle opening 265 to make contact with corresponding contacts 144 on the top and/or bottom sides of the flexible circuit 140. It is to be appreciated that the location of spring compression contacts an alternatively, or additionally, located on the flexible circuit 140. Alternatively, or in addition, various latches can be included within the socket connector housing 260 to help secure the flexible circuit 140 in place. In the illustrated embodiment an adhesive 280 can be applied around the flexible circuit 140 and adjacent the side receptacle opening 265 to secure the flexible circuit 140 inside the side receptacle opening 265.

Referring again to FIG. 11, similar to previous descriptions an electronic component 141 may be mounted on the flexible circuit, which can be bent or folded around a side edge of the SiP 125. The electronic component 141 may additionally be electrically connected to the routing substrate 101 via the socket connector housing 260. The electronic component 141 can be a variety of components, such as a sensor that is oriented adjacent an opening 202 in a housing 200 of the electronic module 100.

Figure 13A:
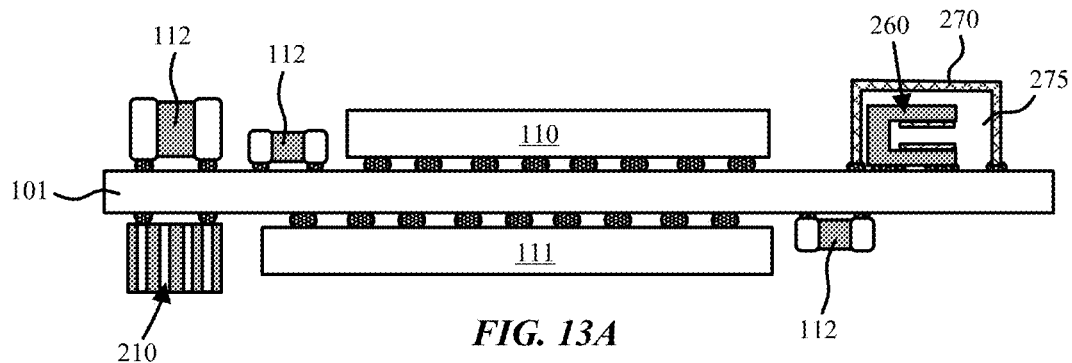
FIGS. 13A-13D are cross-sectional side view illustrations of method of forming an electronic module including socket connector housing for receiving a flexible circuit in accordance with an embodiment.

FIGS. 13A-13D are cross-sectional side view illustrations of method of forming an electronic module including socket connector housing for receiving a flexible circuit in accordance with an embodiment. Specifically, the process flow of FIGS. 13A-13C can be used to fabricate the electronic module of FIG. 11. Initially the one or more electronic components 110, 111 and additional electronic components 112 are surface mounted on the routing substrate 101 as shown in FIG. 13A. In the illustrated embodiment, a socket connector housing 260 is mounted on the first side of the routing substrate 101, followed by mounting a shield can 270 on the same side of the routing substrate 101 and over the socket connector housing 260. While a single socket connector housing 260 and shield can 270 are illustrated, multiple socket connector housing and shield cans can be mounted on one or more sides of the routing substrate 101. Furthermore, the shield can may be a portion of the socket connector housing.

Figure 13B:
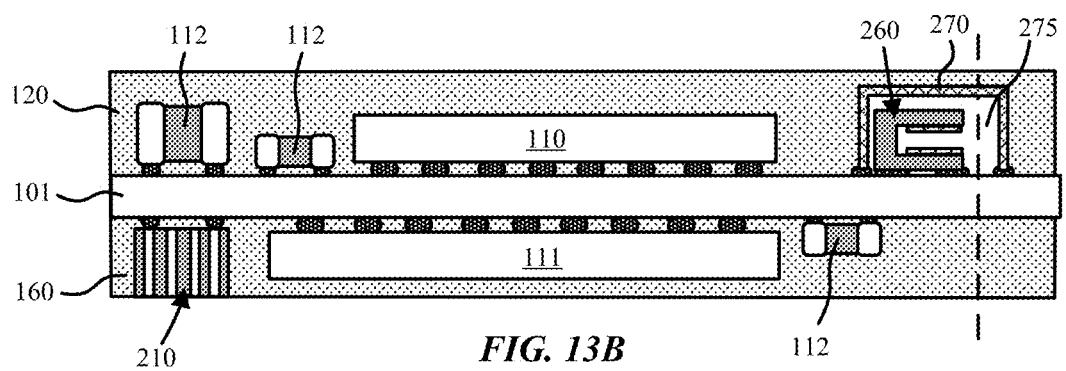
Figure 13C:
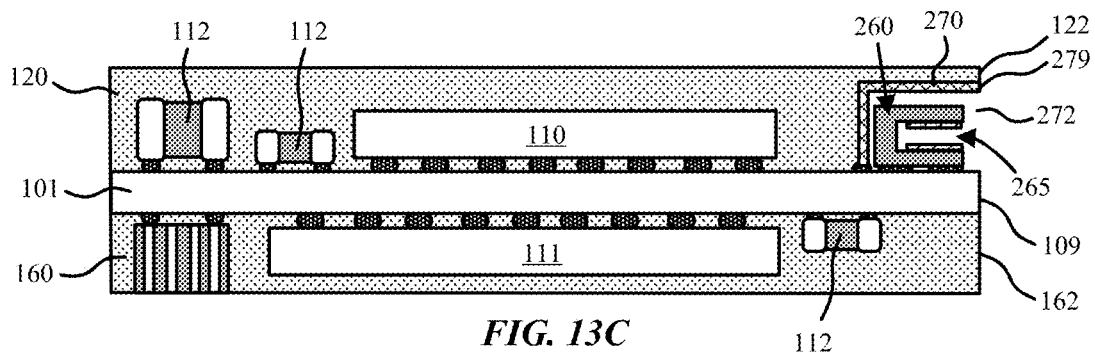
Figure 13D:
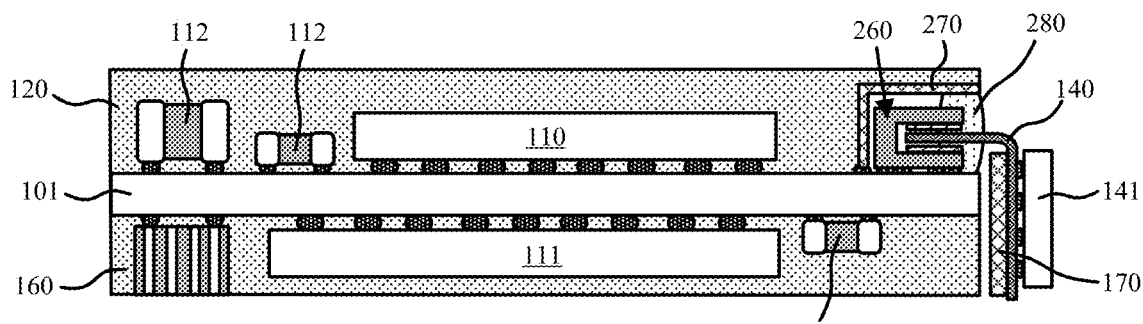

One or both sides of the routing substrate 101 can then be overmolded (encapsulated) with molding compound layers 120, 160 as shown in FIG. 13B. As shown, the shield can 270 can prevent flow into the socket connector housing 260. The molding compound layers, shield can 270, and routing substrate can then be cut (e.g. singulation process) to expose side surfaces 122, 162 of the molding compound layers 120, 160 as well as side surfaces 279 of the shield can 270 and side surface 109 of the routing substrate 101 resulting in the structure illustrated in FIG. 13C, with exposed cavity 272 including the socket connector housing 260. When singulating multiple SiPs from a reconstituted structure multiple socket connector housings 260 can be mounted within the same shield can 270 (with side receptacle opening 265 facing one another), and singulation can be performed between the socket connector housings 260, thus utilizing a single shield can for multiple SiPs. A flexible circuit 140 can then be inserted through the cavity 272 in the first molding compound layer 120 and int the side receptacle opening 265 as shown in FIG. 13D. This may optionally be followed by application of an adhesive 280 around the flexible circuit 140 and adjacent the side receptacle opening 265 to secure the flexible circuit inside the side receptacle opening. In accordance with embodiments, the flexible circuit 140 may be inserted with minimal insertion force needed to compress the spring compression contacts or latches, and a separate actuator is not present on the socket connector housing 260 to retain contact.

Figure 14A:
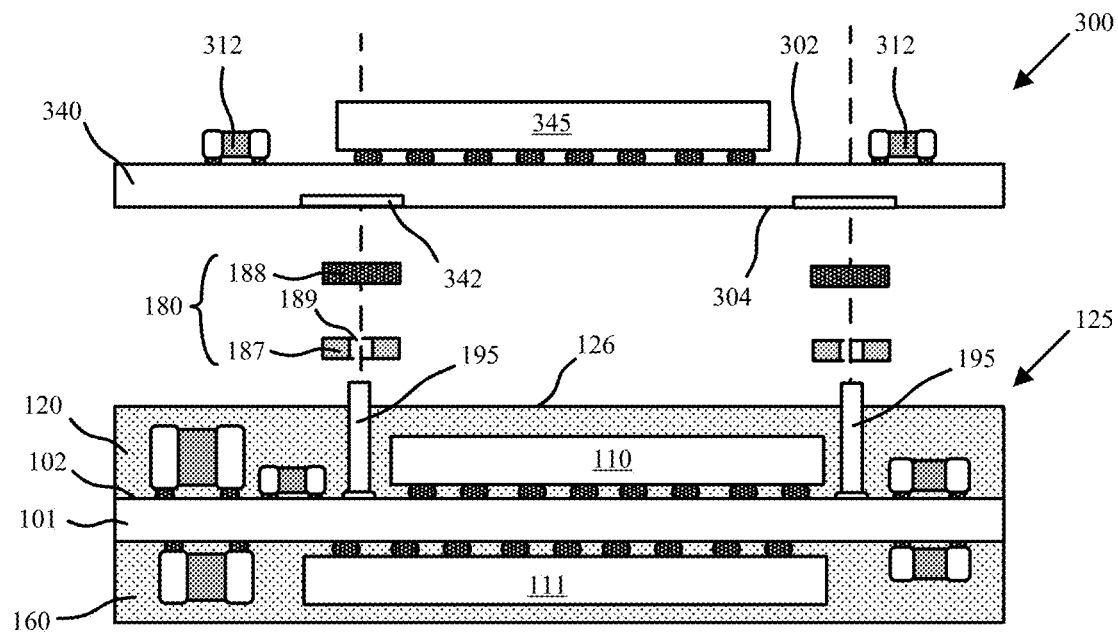
FIGS. 14A-14B are cross-sectional side view illustrations of method of forming an electronic module including a 3D molded stack and button joints in accordance with an embodiment.
Figure 14B:
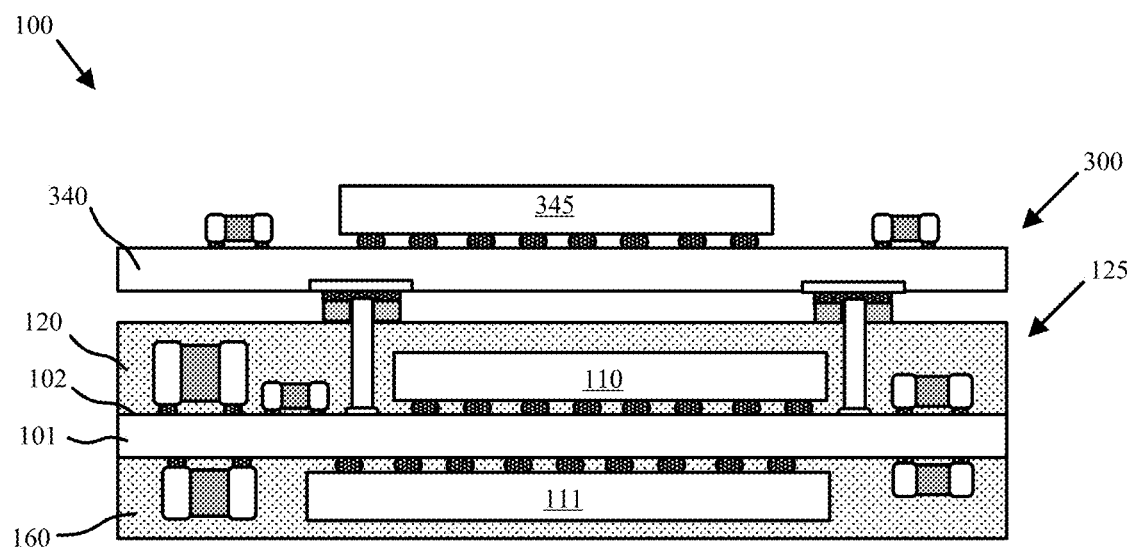

Referring now to FIGS. 14A-14B cross-sectional side view illustrations are provided for a method of forming an electronic module 100 including a 3D molded stack and button joints in accordance with an embodiment. The assembly process is similar to that illustrated and described with regard to FIG. 6, with a difference being that button joints are used to form vertical 3D stacked structures. As shown, the electronic module 100 includes an SiP 125 similar to those previously described herein. For example, the SiP 125 includes a routing substrate 101, a first electronic component 110 mounted on a first side 102 of the routing substrate and encapsulated in a first molding compound layer 120. The primary structural difference for the SiP 125 in FIGS. 14A-14B is the inclusion of one or more vertical interconnects 195 5bonded to the first side 102 of the routing substrate 101 (e.g. with solder) and encapsulated in the first molding compound layer 120. Furthermore, a portion of the vertical interconnect 195 protrudes from a top exterior surface 126 of the first molding compound layer 120. As shown an electronic assembly 300 can then be bonded to the vertical interconnect(s) 195 of the SiP 125 with a solder material.

In an embodiment, the electronic assembly 300 includes a circuit board 340 and a second electronic component 345 mounted on a first side 302 of the circuit board. Additional electronic components 312 may also be mounted on the first side 302 of the circuit board. A second side 304 of the circuit board 340 including landing pads 342 is bonded to the vertical interconnect(s) 195. Similar to the description of FIG. 6, buttons 187 can be placed over the exposed vertical interconnects 195, followed by optional dispensing of a solder paste 188. Upon applying heat and pressure the buttons 187 and solder paste 188 can reflow to create a solder joint.

Such a configuration may allow for miniaturization without substantial changes at the system level. Furthermore the solderable buttons 187 can allow for fine pitch interconnection between molded assembly, with fine pitch of less than 300 μm.

In utilizing the various aspects of the embodiments, it would become apparent to one skilled in the art that combinations or variations of the above embodiments are possible for forming an electronic module. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An electronic module comprising:
   a system-in-package including:
   a routing substrate;
   a first electronic component mounted on a first side of the routing substrate and encapsulated in a first molding compound layer; and
   a socket connector housing mounted on the routing substrate and within a cavity in the first molding compound layer, the socket connector housing including a side receptacle opening;
   wherein the cavity is exposed along a first side surface of the first molding compound layer;
   a flexible circuit extending into the cavity from outside the first molding compound layer and connected inside the side receptacle opening of the socket connector housing.

2. The electronic module of claim 1, further comprising a shield can over the socket connector housing and embedded within the first molding compound layer.

3. The electronic module of claim 2, wherein the cavity is defined by the shield can.

4. The electronic module of claim 3, comprising an open space separating a top surface of the socket connector housing and a lid of the shield can.

5. The electronic module of claim 3, wherein a lid of the shield can is directly on a top surface of the socket connector housing.

6. The electronic module of claim 2, wherein the socket connector housing is laterally offset from the first side surface of the first molding compound layer.

7. The electronic module of claim 1, further comprising an adhesive applied around the flexible circuit and adjacent the side receptacle opening to secure the flexible circuit inside the side receptacle opening.

8. The electronic module of claim 1, wherein the socket connector housing includes a plurality of spring compression contacts.

9. The electronic module of claim 8, wherein the plurality of spring compression contacts includes a top group of spring compression contacts and a bottom group of spring compression contacts.

10. The electronic module of claim 9, wherein the flexible circuit includes a top group of contacts directly connected to the top group of spring compression contacts and a bottom group of contacts directly connected to the bottom group of spring compression contacts.

11. The electronic module of claim 1, wherein the flexible circuit includes a plurality of spring compression contacts inserted into the socket connector.

12. The electronic module of claim 1, further comprising a shield can over the socket connector housing and embedded within the first molding compound layer, wherein the shield can is electrically conductive.

13. The electronic module of claim 1, further comprising a shield can over the socket connector housing and embedded within the first molding compound layer, wherein the shield can is electrically insulating.

14. The electronic module of claim 1, further comprising an integrated electronic component mounted on the flexible circuit, wherein the integrated electronic component is electrically connected with the routing substrate.

15. The electronic module of claim 14, wherein the electronic component comprises a sensor.

16. The electronic module of claim 15, wherein the system-in-package and the flexible circuit are secured in a housing, and the sensor is oriented adjacent an opening in the housing.

* * * * *